United States Patent [19]

Yorikane

[11] 4,263,606
[45] Apr. 21, 1981

[54] LOW STRESS SEMICONDUCTOR DEVICE LEAD CONNECTION

[75] Inventor: Masaharu Yorikane, Tokyo, Japan

[73] Assignee: Nippon Electric Co., Ltd., Japan

[21] Appl. No.: 925,324

[22] Filed: Jul. 17, 1978

[30] Foreign Application Priority Data

Jul. 18, 1977 [JP] Japan ................................ 52/86524

[51] Int. Cl.³ ................ H01L 23/48; H01L 29/46; H01L 29/54
[52] U.S. Cl. ........................ 357/71; 357/65; 357/67; 357/68
[58] Field of Search ............... 357/65, 67, 71, 72, 357/68

[56] References Cited

U.S. PATENT DOCUMENTS

| 3,303,071 | 2/1967 | Kocsis | 357/72 |
| 3,617,818 | 11/1971 | Fuller | 357/71 |
| 3,629,669 | 12/1971 | Kauppila | 357/68 |
| 3,921,200 | 11/1975 | Pille | 357/68 |
| 3,942,187 | 3/1976 | Gelsing et al. | 357/69 |
| 3,953,877 | 4/1976 | Sigusch | 357/72 |
| 4,005,455 | 1/1977 | Watrous et al. | 357/71 |
| 4,045,594 | 8/1977 | Maddocks | 357/71 |
| 4,051,508 | 9/1977 | Sato et al. | 357/71 |
| 4,060,828 | 11/1977 | Satonaka | 357/71 |

OTHER PUBLICATIONS

IBM Technical Disclosure Bulletin; by Ainslie, vol. 11, No. 10, Mar. 1969, p. 1339.

Primary Examiner—Andrew J. James

[57] ABSTRACT

An external connection structure for an integrated semiconductor device is disclosed. The semiconductor device includes a substrate on which a wiring layer, which is covered by an insulator layer is disposed. According to the invention, an aperture is provided in the insulative layer to expose the wiring layer. A metallic film lines the aperture, covering the exposed portion of the wiring layer and defining a recess. A bump type electrode of a malleable metal is disposed in the recess. The bump electrode is spaced from the side walls of the recess, and projects beyond the surface of the metallic film surrounding the recess for connection under pressure with an external lead plate.

5 Claims, 15 Drawing Figures

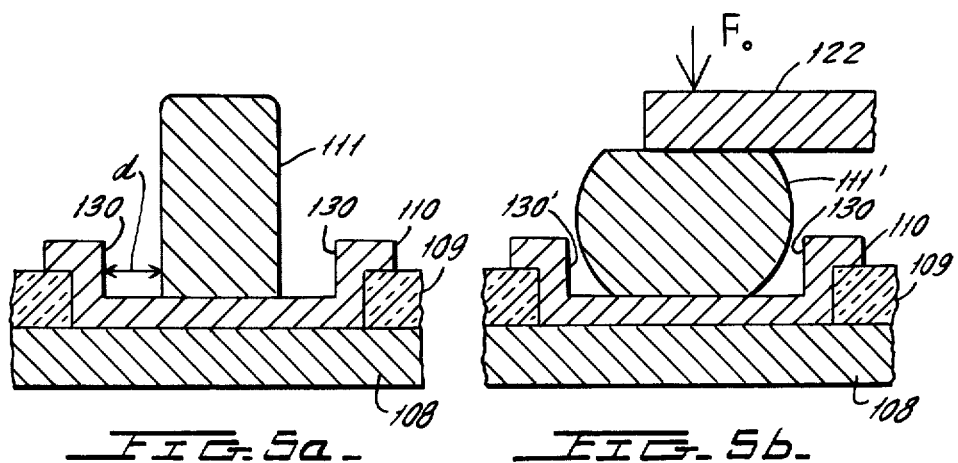
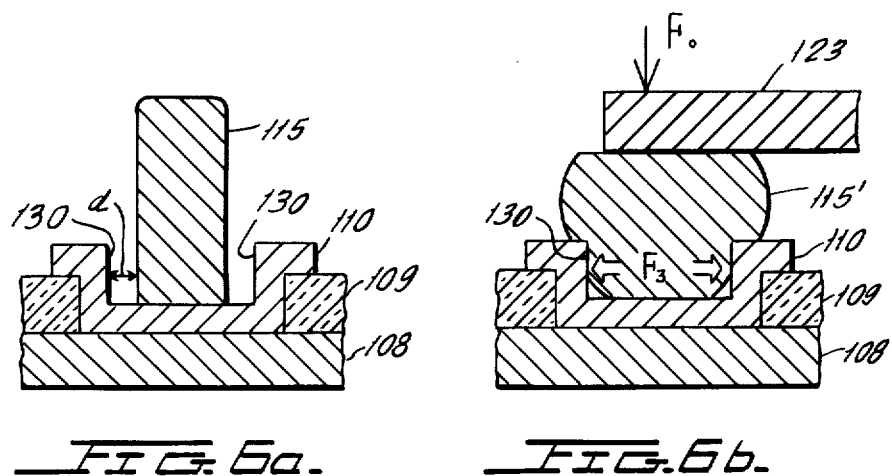

LOW STRESS SEMICONDUCTOR DEVICE LEAD CONNECTION

BACKGROUND OF THE INVENTION

The present invention relates to a semiconductor device, and more particularly, to a semiconductor device in which metallic protrusions (hereinafter called "bumps") are provided at an electrode wiring section on a semiconductor chip to make electrical connection with external leads.

Heretofore, electrodes have been formed on a semiconductor chip with a silicon substrate or the like in the following manner. After required circuit elements are formed in a semiconductor chip and the surface of the chip is covered with an insulator film (for example, a silicon oxide film), the insulator film is partially removed by etching at portions where electrical connection to regions of semiconductor chip is required to form apertures. Then, aluminum is deposited over the surface of the chip including the apertures and is partially removed by etching to form a predetermined pattern of wirings. At portions of the wirings where external leads are to be connected, a thin film of titanium, platinum or the like is formed and bumps of highly conductive metal such as gold, silver or the like are formed thereon by plating. The external leads are connected to the bumps by thermo-compression bonding. The intermediate thin film of titanium or platinum is necessary, because if the gold bumps are directly contacted with the aluminum layer without the intermediate thin film, then an alloy layer called "purple plague" would be formed therebetween by chemical reaction between aluminum and gold and cracks would arise therebetween due to volume increment by formation of this alloy which would result in anomalous increase in a resistance or breaking of a circuit.

Various proposals have been made for connection between external leads and bumps, and one of them is disclosed in British Pat. No. 1,196,834. According to this disclosure, aluminum electrodes making electrical contact with operating regions of a semiconductor chip are formed extending onto an oxide film outside of the operating region, and then at an end of the aluminum electrode, a layer of refractory metal such as titanium, chromium, or tungsten, serving as a barrier film for preventing formation of the purple plague is formed so as to overlap the end of the aluminum electrode. Thereafter an oxide film is formed over the surface of the chip, and the predetermined part of the oxide film on the refractory metal layer is selectively removed by etching to make an aperture in which the refractory metal is exposed. A conductive metal layer of conductive metal liable to be wetted with solder (tin-lead alloy), such as a layer of nickel, copper or gold is formed within the aperature. Thereafter, the whole chip is immersed in a solder bath to form a bump of solder on the conductive metal layer within the aperture.

The bump thus formed is in contact with the inner wall of the oxide layer in the aperture. Therefore upon thermo-compression bonding an external lead to the bump, the bump would be deformed by the mechanical force exerted thereon due to the thermo-compression bonding, and it is liable to occur that cracks are produced in the oxide film or the oxide film is torn off around the bump due to the stress associated with the deformation. Consequently, humidity and contamination would enter from external atmosphere into the semiconductor device through the cracks or the torn portions and would corrode the conductive metal as well as the aluminum wiring, which causes accidents such as poor connection or breaking of a circuit or degradation of electrical performances of the device.

According to another proposal in the prior art such as disclosed, for example, in U.S. Pat. No. 3,942,187, an aluminum wiring layer is provided extending from an operating region of a chip onto a first oxide film, and further, a first nickel layer is formed on the oxide film so as to overlap the end of the aluminum wiring layer. Thereafter, a second oxide film layer is formed over the entire surface of the chip and is partially removed from a portion on the first nickel layer to provide an aperture where a second nickel layer is formed within the aperture as well as on the peripheral portion of the aperture. A bump of copper or gold is provided on the second nickel layer so as to cover the aperture. However, even with this structure, the bump would be deformed laterally, when an external lead is bonded thereto, by the pressure exerted upon the bonding, and consequently cracks or tear-off would arise in the second oxide film layer located around the deformed bump due to the stress associated with the deformation. Therefore, it is inevitable that the reliability of the semiconductor device is greatly lowered.

BRIEF SUMMARY OF THE INVENTION

It is a primary object of the present invention to provide a semiconductor device having an excellent reliability in which, upon bonding an external lead to a bump formed on a semiconductor chip, generation of cracks and tears of an insulator film caused by a mechanical pressure exerted upon the bump can be prevented.

The semiconductor device according to the present invention is characterized in that a metallic bump has a smaller area than that of a recess made by an aperture of an insulator film at the intended connecting portion of an internal wiring layer and is formed within the recess remote to the inner wall of the recess.

According to the present invention, when external leads are bonded to the metallic bumps provided on or above the connecting portions of the internal metallic wiring on a semiconductor chip, thermo-compression bonding and the bumps are deformed by a mechanical pressure associated with the bonding operation, a stress associated with deformation of the bumps would not be applied directly to the insulator film, because the metallic bumps and the recess made by aperture of the insulator film are located separately from each other. In order words, the separation gap between the insulator film and the bump allows the deformation of the bump caused by the bonding operation and the stress is absorbed by the bump inself and is not transmitted to the insulator film. Consequently, cracks are not generated in the protective film and the protective film is not torn. The connection with the external leads can be effected reliably without deteriorating the protective effect of the film, so that it is possible to provide a semiconductor device having an excellent reliability.

BRIEF DESCRIPTION OF THE DRAWINGS

FIG. 5(a) is a cross-sectional view showing the bump structure of the semiconductor device according to one preferred embodiment of the present invention, and FIG. 5(b) is a cross-sectional view showing deformation of the bump structure shown in FIG. 5(a) when a mechanical pressure is applied to the bump; and FIG. 6(a) is a cross-sectional view showing an undesirable mode of embodiment of the bump structure of the semiconductor device, and FIG. 6(b) is a cross-sectional view showing deformation of the bump structure shown in FIG. 6(a) when a mechanical pressure is applied to the bump.

DETAILED DESCRIPTION OF THE INVENTION

Figure 1A:
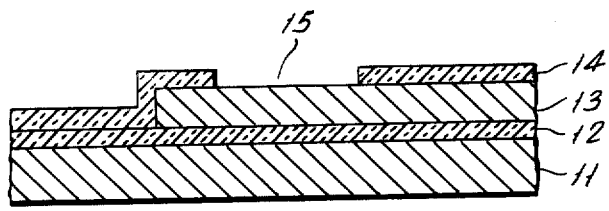
FIGS. 1(a) to 1(c) are cross-sectional views showing a bump portion of a prior art semiconductor device in successive steps of the formation of the bump.
Figure 1B:
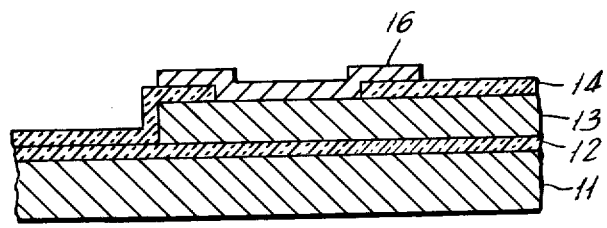
Figure 1C:
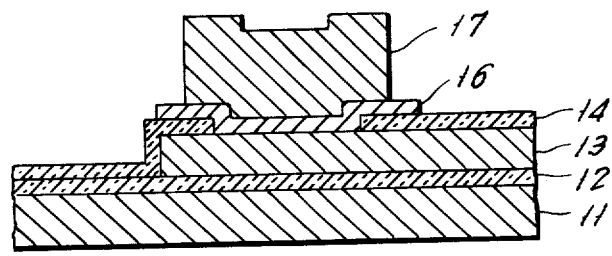

The semiconductor device of the prior art has the structure illustrated in FIGS. 1(a) to 1(c). A silicon substrate 11 covered with a first protective film 12 of silicon dioxide is prepared, in which desired circuit elements are formed. An aluminum wiring layer 13 is formed on the film 12 and a second protective film 14 of silicon dioxide is deposited on the first protective film 12 and the wiring layer 13. An aperture 15 is opened in the second film 14 at a portion where a bump 17 is to be formed, as shown FIG. 1(a). A barrier layer 16 of a refractory metal is formed successively within the aperture 15 and on the second film 14 at the periphery of the aperture 15, as shown in FIG. 1(b). Then a bump 17 which is registered in position with the aperture 15 and has a bottom area larger than the area of the aperture 15 or the area of the recess of the film 16 is formed on the barrier layer 16 (FIG. 1(c)). When this bump 17 and an external lead (not shown) are bonded together through a thermo-compression bonding process, a mechanical pressure is applied to the top surface of the bump 17, so that a concentrated stress associated with this mechanical pressure is impressed upon the bottom portion of the bump 17 in contact with the protective metal 16. This mechanical pressure causes the protective film 14 to widen the aperture 15. Due to this stress, the protective film 14 about the portion right under the end portion of the bump 17 is liable to be destroyed or torn, and external humidity and contamination would enter into the device through the destroyed or torn portion and would deteriorate the electrical characteristics and corrode the aluminum wiring path 13, so that the semiconductor devices of the above-described type in the prior art had extremely undesirable shortcomings in reliability.

In order to eliminate such shortcomings, the present invention provides a novel structure of a semiconductor device illustrated in FIGS. 2(a) to 2(d) as one preferred embodiment of the invention.

Figure 2A:
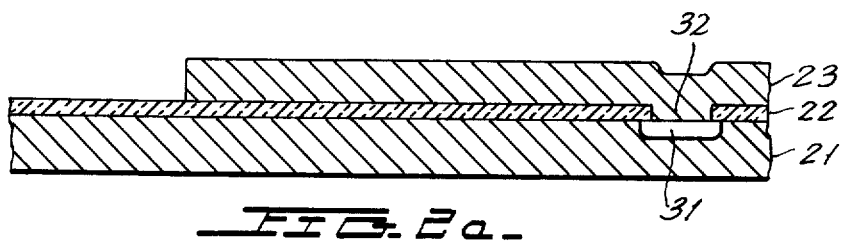
FIGS. 2(a) to 2(d) are cross-sectional views showing a semiconductor device according to one preferred embodiment of the present invention in successive steps of the formation of the bump.
Figure 2B:
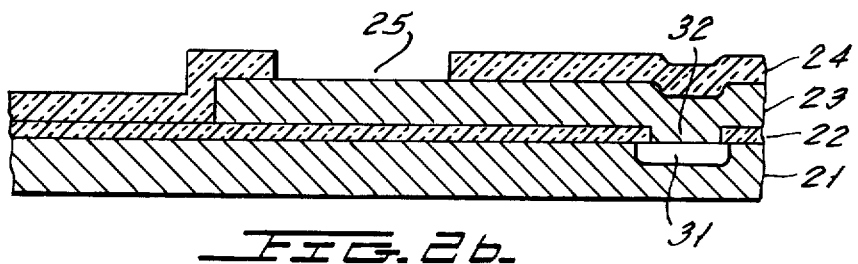
Figure 2C:
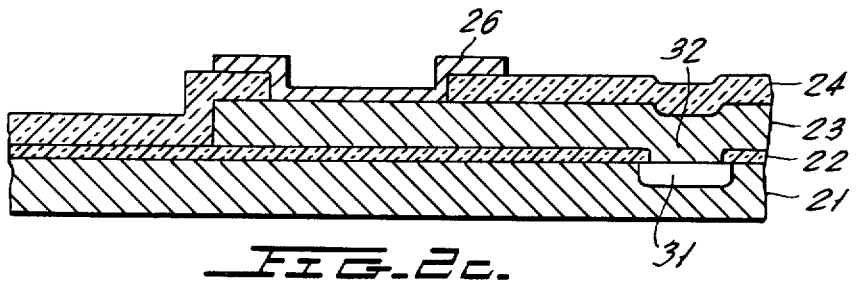
Figure 2D:
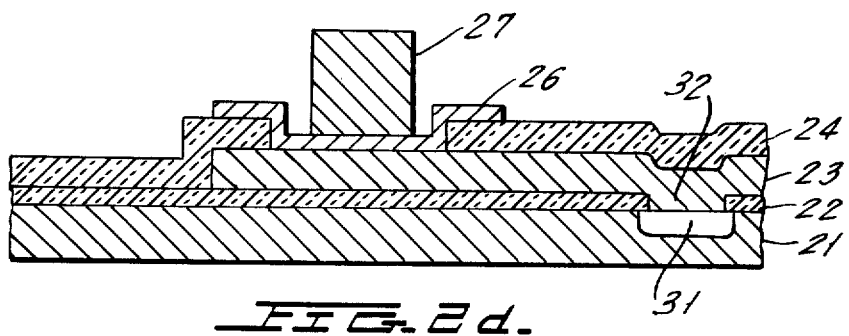

Referring to FIG. 2(a), a semiconductor substrate 21 such as silicon substrate covered with an electrically insulating film 22 of, e.g., silicon dioxide is prepared, in which desired circuit elements are formed. An internal wiring layer 23 is formed on the insulating film 22, one end of which is connected to an operating region 31 of the substrate 21 through an aperture 32 of the insulating film 22. As a material of the wiring layer 23 aluminum is typically employed and a pattern of the wiring layer 23 is formed by an etching process. Then over the surface of the substrate 21 including the wiring layer 23 is formed a protective insulator film 24 by vapor deposition, and thereafter, a desired aperture 25 is provided by etching at a portion where a bump is to be formed as shown in FIG. 2(b). As the protective film 24, normally a silicon di-oxide film is used for the purpose of preventing the wiring layer 23 from corrosion and mechanical damage, and the thickness of the protective film 24 is about 5000 Å in this example. Subsequently, a proTective metal layer (barrier layer) 26 of a refractory metal such as molybdenum, tantalum, tungsten chromium, or titanium is formed on the exposed portion of the wiring layer 23 in the aperture 25 and on the protective film 24 at the periphery of the aperture 25 for preventing the formation of the purple plague, which is caused by mutual diffusion of aluminum of the wiring path 23 and gold of a bump, as shown in FIG. 2(c). In general, the protective metal layer 26 is hardly etched because its etching speed by the chemical ethant is low. Therefore, a lift-off process is favorably employed for forming the pattern thereof. Subsequently, a bump 27 is so formed, as shown in FIG. 2(d), that the bump 27 is positioned within the aperture 25 and within the recess of the layer 26 made by the aperture without contacting with the inner peripheral sides of the recess and has a smaller bottom area which is contacted with the surface of the protective metal layer 26 than the area of any of the aperture 25 and the recess.

When an external lead (not shown) is bonded to the bump 27 of the above-described structure by a thermo-compression or other bonding method applying a mechanical pressure to the bump 27, the bump 27 is deformed by a mechanical pressure and the stress is then concentrated at the bottom edge of the bump 27 in contact with the protective metal layer 26 but not appliyd to the protective film 24 due to a gap between the inner peripheral side surface of the aperture 25 or the recess and the bump 27. In other words, the mechanical pressure generated upon bonding can be absorbed by the bump 27 itself and therefore, the protective film 24 would never be applied with such an excessive pressure that it may be either destroyed or torn due to the pressure. Consequently, even if the bump 27 and an external lead are connected under a mechanical pressure, the protective film 24 retains its normal protection effect, and a semiconductor device having a high reliability can be obtained.

The height of the bump 27 is about 20 μm in the example, and favourably the bump 27 is formed of gold by plating. In this case, photo-resist mask is deposited to cover the semiconductor chip except for the location where the bump 21 is to be formed, and the bump 27 is formed by electroplating. On the other hand, the protective metal layer 26 serves to protect the aluminum internal wiring 23 within the aperture 25, and also, in case where the bump 27 and the internal wiring 23 are made of different metals as is the case of the above-described embodiment (aluminum-gold), it serves to prevent mutual diffusion therebetween. The thickness of the protective metal layer 26 is about 2000 Å in this example.

Now, in order to further clarify the effects of the semiconductor device according to the present invention, description will be made with reference to FIGS. 3 to 6.

Figure 3A:
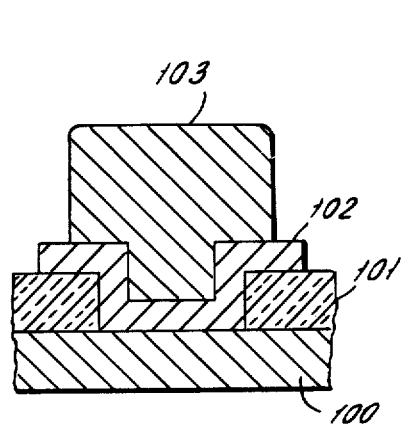
FIGS. 3(a) and 4(a) are cross-sectional views showing bump structures of semiconductor devices in the prior art.
Figure 3B:
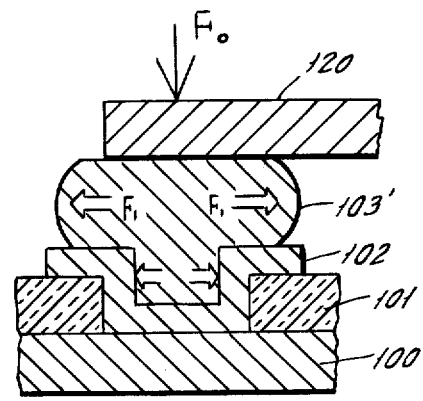
FIGS. 3(b) and 4(b) are cross-sectional views showing deformation of the bumps shown in FIGS. 3(a) and 4(a), respectively, when a mechanical pressure is applied to the bumps.
Figure 4A:
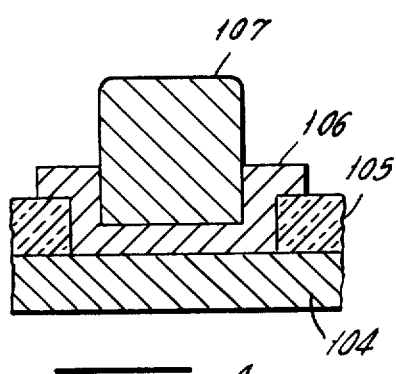

Cross-sectional views illustrating bump structures in the prior art are shown in FIGS. 3(a) and 4(a), in which a predetermined portion of a silicon oxide protective films 101 and 105 corresponding to the second protective film 14 shown in FIGS. 1(a) to 1(c) on an aluminum internal wiring layers 100 and 104 corresponding to the wiring path 13 shown in FIGS. 1(a) to 1(c), respectively, are removed by etching, and then a protective metal layers 102 and 106 corresponding to the protective metal layer 16 shown in FIGS. 1(a) to 1(c) is formed. FIG. 3(a) shows a subsequent state where a bump 103 has been formed within an aperture as extended up to the upper surface of the silicon oxide film 101, while FIG. 4(a) shows an alternative subsequent state where a bump 107 has been formed only within the aperture with its side surface kept in contact with an inner peripheral side surface of the protective film 106 in the aperture in the silicon oxide film 105. When the bumps 103 and 107 are connected with an external lead 120 and 121 as shown in FIGS. 3(b) and 4(b), under a mechanical pressure Fo by a thermo-compression bonding process, the bump 103' and 107' will be deformed by the mechanical pressure Fo applied to the top surface of the bumps 103' and 107', and the stress associated with this deformation is applied to both the protective metal layers 102 and 106 and to the silicon oxide films 101 and 105, respectively.

The external leads 120 and 121 are made of copper and plated with gold or silver. They are respectively placed on the top surface of the bumps 103 and 107. Thereafter, the mechanical pressure Fo is supplied on the top surface of the external leads 120, 121 to connect the bump 103' to the lead 120 and the bump 107' to the lead 121. In this process, the value of the mecanical pressure Fo needs about 1,000 kg/cm$^2$ in the temperature range from 400° C. to 500° C.

Figure 4B:
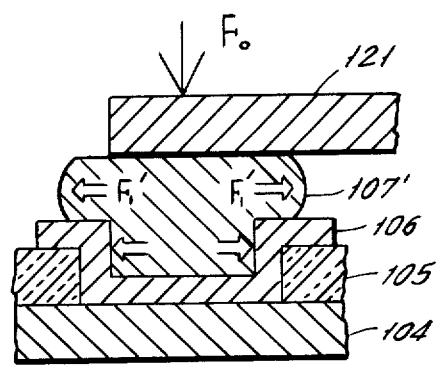

As will become apparent by comparing FIGS. 3(a-)and 4(a) with FIGS. 3(b) and 4(b), respectively, prior art bumps 103' largely deformed in the lateral directions on the protective metal layer 102, 106 and above the silicon oxide film 101, 105 by the internal stresses $F_1$ and $F_1'$.

The internal stresses $F_2$ are transmitted to the silicon oxide films 101 and 105 via the protective metal layer 102 and 106. As a result, cracks and tears arise in the silicon oxide film 101 and 105.

Even with the bump 107 not formed above the silicon oxide film 105 but formed in contact with the inner side surface of the recess of the protective metal layer 106, since the pressure F$_0$ is uniformly applied to the entire bump 107', not only the bump 107' is deformed over the protective metal layer 106 by the internal stress $F_1'$, but also the internal stress $F_2'$ occurs to stress the metal lay 106' and the silicon oxide film 105 in the lateral directions via the side surface of the recess, that is, via the side surface where the protective metal layer 106 makes contact with the bump 107', so that cracks and tears will be also generated in the silicon oxide film 105.

FIG. 5(a) shows a bump structure according to the present invention in which a silicon oxide protective film 109 corresponding to the protective film 24 shown in FIGS. 2(a) to 2(d) on an aluminum internal wiring layer 108 corresponding to the wiring path 23 shown in FIGS. 2(a) to (d) is selectively and partly removed to form an aperture, and the recess as separated from inner side surfaces 130 of the protective metal layer 110. A shown in FIG. 5(b), when the bump 111 and an external lead 122 are connected with each other, the bump 111' is deformed by the mechanical pressure F$_0$ (about 1000 Kg/cm$^2$) applied to the top surface of the bump 111', but the stress associated with the deformation would not be applid directly to the silicon oxide film 109 through the inner side surfaces 130' of the protective metal layer 110, because the deformation occurs only within the aperture. Consequently, connection can be achieved reliably, and cracks and tears are not generated in the protective film 109, so that a semiconductor device having an extremely high reliability can be provided.

Here, it is to be noted that in the bump structure illustrated in FIG. 5(a), the separation distance d between the protective metal side surface 130 and the side surface of the bump 111 could be appropriately varied depending upon the materials and dimensions of the bump 111, protective metal layer 130 and protective film 109 and upon the magnitude of the mechanical pressure applied during the bonding operation. However, if a separation distance d' between a protective metal layer 110 and a bump 115 is too small as illustrated in FIGS. 6(a), then the bump 115 will be deformed as shown in FIG. 6(b) by the mechanical pressure F$_0$ applied thereto beyond the inner edge 230 of the layer 110, the stress F$_3$ is transmitted to the protective metal layer 110 and the protective film 109 without being sufficiently mitigated, so that there is a fear that cracks and tears may arise in the protective film 109. In the case of the construction according to the preferred embodiment shown in FIG. 2, the separation distance ranging from 3 μm to 15 μm could be provided for the diameter of the recess in the protective metal layer 26 of 100 μm. In other words, the bump has a bottom area as small as 49 to 88 percent of the internal area of the recess.

However, the present invention should not be limited to the above-described embodiment, but the invention is featured by the formation of the bump which is located within the aperture or recess made by the protective film on or above the internal wiring layer and which has a smaller bottom area than the area of any of the aperture and the recess. Furthermore, in such a bump structure, although the sepration distance between the bump and the side surface of the recess is determined by various factors such as the materials and dimensions of the bump, protective metal layer and protective film and the magnitude of the mechanical pressure, the effect of the present invention can be fully achieved, so long as such degree of distance is maintained that the stress associated with the bump deformation caused by the mechanical pressure upon interconnection of the bump with an external lead may be sufficiently mitigated. In this point of view, the bottom area of the bump shall be at most 90% of the inner area of the recess in which the bump is formed. It is of course favorable that the bump is so separated from the inner wall of the recess that the bump is not brought into contact with the inner wall of the recess even by deformation thereof due to mechanical pressure for the bonding.

In addition, while a silicon dioxide film was used as a protective film in the above-described embodiment, other appropriate insulator films such as a silicon nitride film, a glass film, or a combination of these films could be used, and for the protective metal, besides Mo, Ta and W other metals such as Pt, Ti, etc. could be used, so long as the metal can prevent mutual diffusion between the bump of gold and the internal wiring path of aluminum. Furthermore, for the bump material, not only gold, but also silver could be employed.

A semiconductor device according to the invention may have a plurality of bumps having the above-described structure on one semiconductor chip, and a plurality of external leads may be bonded to the bumps simultaneously. In particular, many bumps may be simultaneously fabricated in the same process in an LSI device.

What is claimed is:

1. A semiconductor device comprising: a semiconductor substrate; a first insulating film covering at least a portion of said substrate; a wiring path formed on said first insulating film; a second insulating film covering said wiring path; an aperture being provided in said second insulating film, exposing at least a portion of said wiring path; a first protective metal layer entirely covering said portion of said wiring path exposed through said aperture, to form a recess therein; a bump electrode terminal made of a metal provided in said recess on said first metal layer, said bump electrode terminal being in contact with said first metal layer over an area smaller than the area of said recess; said terminal further having a bottom surface, a top surface and a side surface; said bump electrode terminal protruding from said recess beyond said first protective metal layer; and an external lead plate having an end portion which has been connected to said top surface of said bump electrode terminal by means of mechanical pressure in such a manner that said side surface of said bump electrode terminal has been deformed laterally toward said first protective metal layer said terminal further having a bottom surface, said side surface being entirely separated from said first protective metal layer except where said side and bottom surfaces meet.

2. A semiconductor device as claimed in claim 1, wherein a metal different from said metal of said bump electrode terminal forms said wiring path.

3. A semiconductor device as claimed in claim 1, wherein said bottom surface of said recess has a bottom surface, and wherein said bump electrode terminal has an area not more than 90% the area of said bottom surface of said recess.

4. A semiconductor device comprising: a semiconductor substrate including a plurality of circuit elements therein; an aluminum internal wiring path formed on said semiconductor substrate and electrically connecting said circuit elements to form a predetermined circuit; a silicon oxide film formed at least on said aluminum internal wiring path; an aperture provided in a predetermined portion of said silicon oxide film, exposing at least a portion of said internal wiring path; a metallic film formed to cover said aperture entirely, to form therein a recess having a peripheral wall, said metallic film being formed of a metal selected from the group consisting of molybdenum, tantalum, tungsten, platinum and titanium; and a gold protrusion formed on said metallic film within said aperture, said gold protrusion being separated from said peripheral surface of said recess; said gold protrusion projecting beyond the surface of said metallic film and having a top surface for connection under pressure with an external lead plate.

5. A semiconductor device as claimed in claim 4, wherein said gold protrusion covers at most 90 percent of the bottom area of said recess.

* * * * *